United States Patent [19]
Itakura et al.

[11] Patent Number: 5,291,524
[45] Date of Patent: Mar. 1, 1994

[54] VITERBI DECODING APPARATUS

[75] Inventors: Eisaburo Itakura; Yuichi Kojima, both of Kanagawa, Japan

[73] Assignee: Sony Corporation, Tokyo, Japan

[21] Appl. No.: 974,531

[22] Filed: Nov. 12, 1992

[30] Foreign Application Priority Data

Nov. 21, 1991 [JP] Japan .................................. 3-331565

[51] Int. Cl.$^5$ .............................................. H04L 27/06
[52] U.S. Cl. ........................................ 375/94; 371/43
[58] Field of Search ....................... 375/38, 39, 42, 58, 375/67, 94, 99; 371/43, 44, 45; 341/51, 81; 329/304

[56] References Cited

U.S. PATENT DOCUMENTS

| | | | |
|---|---|---|---|
| 5,050,191 | 9/1991 | No ......................................... | 375/94 |
| 5,081,651 | 1/1992 | Kubo ...................................... | 341/51 |
| 5,099,499 | 3/1992 | Hammar ............................... | 371/43 |
| 5,155,744 | 10/1992 | Ringlehaan ........................... | 375/94 |

Primary Examiner—Stephen Chin
Attorney, Agent, or Firm—William S. Frommer; Alvin Sinderbrand

[57] ABSTRACT

A Viterbi decoding apparatus for decoding received data by Viterbi decoding comprising a state metric memory circuit, a path memory circuit, and a path decode word decision circuit. The state metric memory circuit stores state metric information obtained by ACS (Adder, Comparator, Selector) processing. The path memory circuit stores path selection information provided by the ACS processing. The path decode word decision circuit weights a plurality of bits with a path decode word of each state according to its degree of likelihood based on state metric information supplied from the state metric memory circuit, cumulatively adding each path decode word obtained by the weighting operation, and comparing a cumulative value obtained by the cumulative adding operation with a preset threshold value to determine decode words. This setup provides sufficiently reliable decode words by a small amount of hardware and in a short processing time to decode, within an average information rate, convolutional codes having information amounting to 30 Mbps or more used in high-definition TV etc.

8 Claims, 6 Drawing Sheets

FIG. 4

| STATE | STATE METRIC (DEGREE OF LIKELIHOOD) | CLASS | PATH MEMORY | WEIGHTING | DECIMAL NOTATION |
|---|---|---|---|---|---|
| 000 | 0 | UPPER | 0 | 00 | 0 |
| 001 | 5 | LOWER | 1 | 10 | 2 |
| 010 | 1 | UPPER | 0 | 00 | 0 |
| 011 | 3 | UPPER | 1 | 11 | 3 |
| 100 | 2 | UPPER | 0 | 00 | 0 |
| 101 | 7 | LOWER | 1 | 10 | 2 |
| 110 | 8 | LOWER | 1 | 10 | 2 |
| 111 | 4 | LOWER | 1 | 10 | 2 |

CUMULATIVE SUM 11

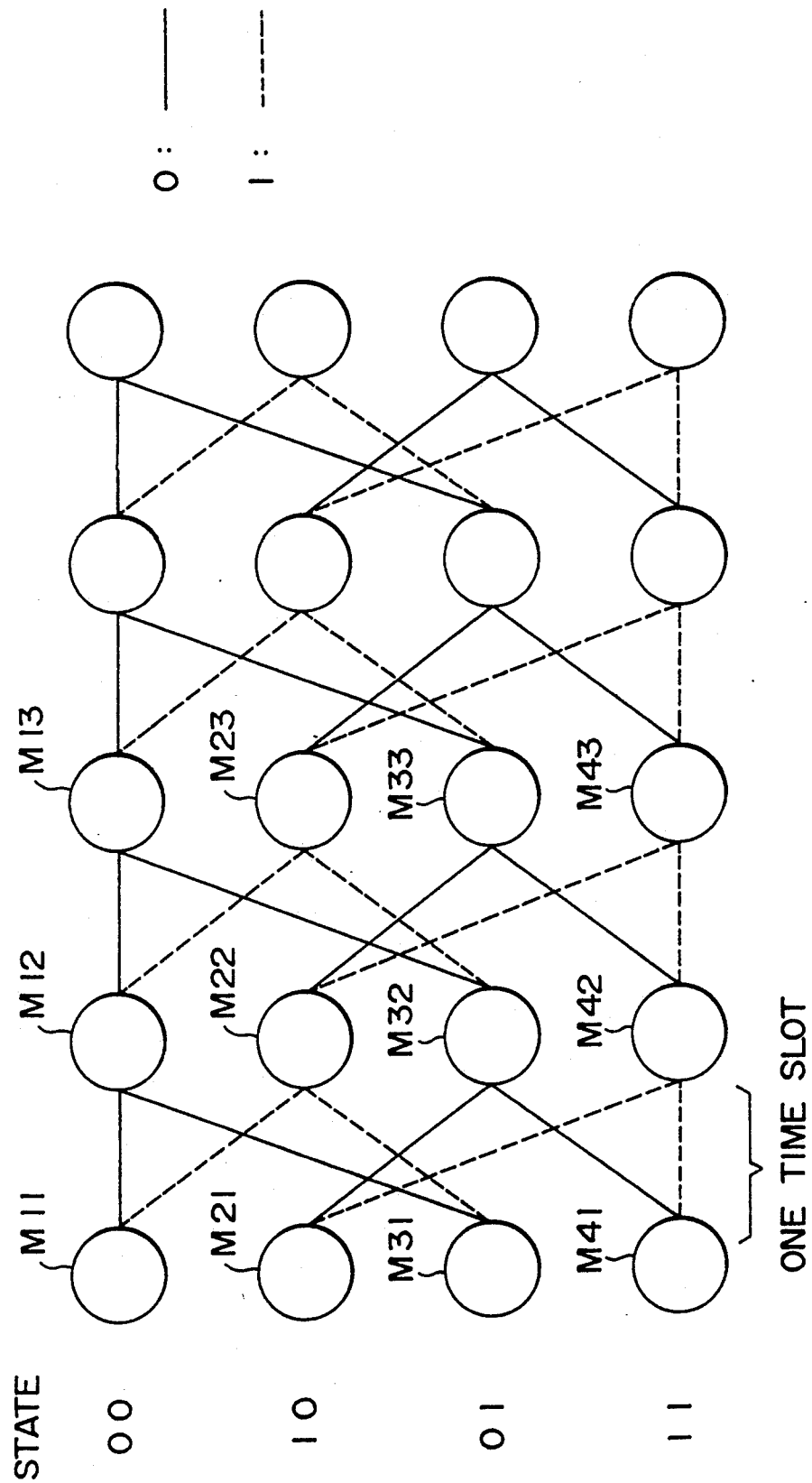

VITERBI DECODING APPARATUS

BACKGROUND OF THE INVENTION

1. Field of the Invention

The present invention relates to a Viterbi decoding apparatus for use in satellite broadcasting, etc.

2. Description of the Prior Art

Conventionally, Viterbi decoding has been known as one of methods for decoding convolutional codes. Viterbi decoding is the maximum likelihood decoding for convolutional codes and selects a code string (called a maximum likelihood path) which most resembles the received code string among those generated by an encoder on the sending side, thereby enabling error correction.

The maximum likelihood path is basically established not by comparing all paths with each other but by obtaining a Hamming distance between all the code strings generated on the sending side and the received code strings to select the path having the smallest Hamming distance cumulative value (that is, the path having the highest degree of likelihood), thereafter checking only those paths which are necessary for decoding (they are called surviving paths). When the lengths of paths are made sufficiently long, the tips (reversely called the roots) of surviving paths will join to be the same value, indicating that each surviving path retrospectively decodes the same value.

Consequently, if a path length is provided such that it will not increase a decoding error ratio, the data at the point of time retrospectively reached by the path length becomes a decode word, thus providing correct decode word reproduction.

FIG. 5 is a block diagram showing an example of a Viterbi decoding apparatus using the Viterbi decoding described above.

The Viterbi decoding apparatus shown comprises a branch metric calculating circuit 101, an ACS (Adder, Comparator, Selector) circuit 102, a normalizing circuit 103, a state metric memory circuit 104, a path memory circuit 105, and a maximum likelihood decode decision circuit 106. When data sent from the sending side (that is, the received data) is supplied to this Viterbi decoding apparatus, the code string most resembles the received code string is selected from among those generated by the encoder on the sending side (the most resembling code is called the maximum likelihood path) to generate decoded data based on the selection.

When the received data is supplied, the branch metric calculating circuit 101 calculates the branch metric of the receive data to send the result (branch metric) to the ACS circuit 102.

The ACS circuit 102, based on a branch metric supplied from the branch metric calculating circuit 101 and a state metric supplied from the state metric memory circuit 104, adds the Hamming distance (branch metric) between received code and path to the cumulative sum (state metric) of the branch metric obtained so far to compare the result with each of two paths joining into a certain state to select the path having a higher degree of likelihood. The ACS circuit 102 then supplies the resulting selection to the path memory circuit 105 and the newly obtained cumulative sum (state metric) to the normalizing circuit 103.

In this case, if a constraint length of "3" is provided, the Hamming distance (branch metric) between received code and path and the cumulative sum (state metric) of the branch metric obtained so far are added to each of the two paths joining into a certain state as shown in the transition diagram in FIG. 6 and are compared with each path for each time slot. The code having highest degree of likelihood is selected based on the comparison.

The normalizing circuit 103 normalizes the state metric output from the ACS circuit 102 to a level within a preset range to send the result to the state metric memory circuit 104.

The state metric memory circuit 104 stores the normalized state metric sent from the normalizing circuit 103 to send the state metric back to the ACS circuit 102.

The path memory circuit 105 stores the selection result output from the ACS circuit 102 to supply it to the maximum likelihood decode decision circuit 106.

The maximum likelihood decode decision circuit 106 determines the maximum likelihood path based on the data stored in the path memory circuit 105 and generates the decoded data to be output.

It should be noted here that the prior art Viterbi decoding apparatus described above must select the path having the smallest state metric from among the path strings stored in the path memory circuit 105 in order to have the maximum likelihood decode decision circuit 106 select the decode word (decoded data) having the highest degree of likelihood.

With the prior art Viterbi decoding apparatus, however, each decoding operation must be performed at the speeds lower than an average information rate. Consequently, when decoding a code string having a very high transmission rate and a long constraint length, too many states resulted make it often difficult to select the maximum likelihood path in time.

For example, if a constraint length is seven bits, the path having the highest degree of likelihood must be selected from among 64 state metrics corresponding to these seven bits, thereby making the decision time long.

For this reason, the prior art apparatus cannot make maximum likelihood decision for decoding within an average information rate in processing information amounting to 30 Mbps or more when decoding convolutional codes used for high-definition TV, etc.

To overcome this problem, several methods have been proposed: with one method, as disclosed in Japanese Patent Publication No. 3-16046, "0"s or "1"s, whichever is greater in number, are output as a decode word; with another method, as disclosed in Japanese Patent Laid open No. 61-128632, a decode word is determined by using the decision by majority of given m.

With these methods, however, the codes having a low degree of likelihood are also determined by majority as decode words, thereby lowering decoding reliability.

Moreover, these methods require long paths for providing a sufficient accuracy, so that it is necessary to make long the path memory in decoding codes having a large constraint length, thereby increasing the amount of necessary hardware to a large extent.

OBJECTS AND SUMMARY OF THE INVENTION

It is therefore an object of the present invention to provide a Viterbi decoding apparatus that can obtain decode words having a sufficient reliability through a small hardware amount in a short processing time, wherein convolutional codes having information amounting to 30 Mbps or more used in high-definition TV, etc can be decoded at a speed within an average information rate.

In carrying out the invention and according to one aspect thereof, there is provided a Viterbi decoding apparatus for decoding received data by Viterbi decoding, this apparatus comprising a state metric memory circuit for storing state metric information obtained by ACS processing, a path memory circuit for storing selection information obtained by the ACS processing, and a path decode word decision circuit for weighting a plurality of bits with a path decode word in each state according to the degree of likelihood based on the state metric information output from the state metric memory circuit, cumulatively adding the path decode words obtained by the weighting, and comparing the cumulative value obtained by the cumulative addition with a preset threshold value to determine the decode word based. Thus, this setup weights a plurality of bits with the path decode word in each state according to the degree of likelihood based o the state metric information output from the state metric memory circuit by the path decode word decision circuit, cumulatively adds the decode words obtained by the weighting, and compares the cumulative value obtained by the cumulative addition with the preset threshold value, thereby making it possible to determine the decode words.

These and other objects as well as advantages of the present invention will become clear by the following description of a preferred embodiment of the present invention with reference to the accompanying drawings.

BRIEF DESCRIPTION OF THE DRAWINGS

FIG. 4 is a schematic diagram depicting the effect of the path decode word decision circuit shown in FIG. 1;

FIG. 6 is a transition diagram showing an operational example of an ACS circuit shown in FIG. 6.

DESCRIPTION OF THE PREFERRED EMBODIMENTS

Figure 1:
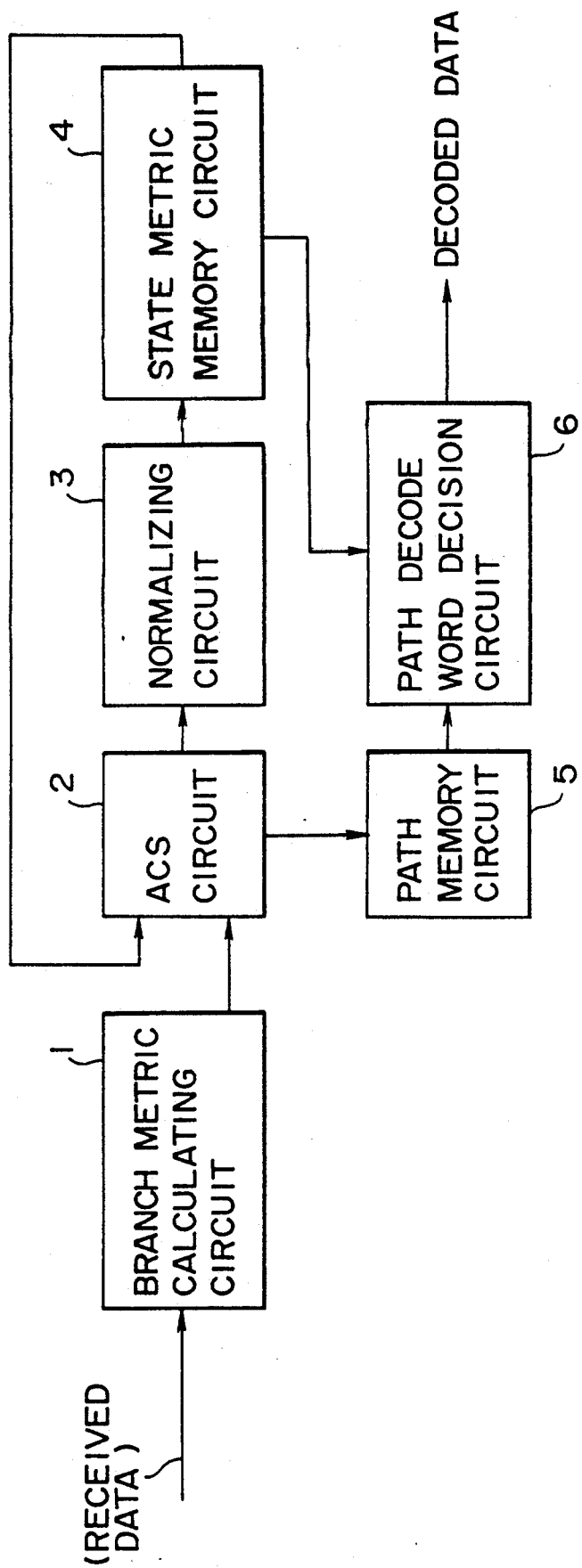
FIG. 1 is a block diagram of a Viterbi decoding apparatus according to one embodiment of the present invention.

FIG. 1 is a block diagram of a Viterbi decoding apparatus according to one emhodiment of the present invention. The Viterbi decoding apparatus shown comprises a branch metric calculating circuit 1, an ACS circuit 2, a normalizing circuit 3, a state metric memory circuit 4, a path memory circuit 5, and a path decode word decision circuit 6. The apparatus, when data coming from the sending side has been applied thereto, selects from among code strings generated by an encoder on the sending side a string nearest a received code string in likelihood to generate decode data based on the selection.

The branch metric calculating circuit 1, when the received data has been applied thereto, calculates its branch metric to supply the result (branch metric) to the ACS circuit 2.

The ACS circuit 2, based on a branch metric supplied from the branch metric calculating circuit 1 and a state metric supplied from the state metric memory circuit 4, adds the Hamming distance (branch metric) between received code and path to the cumulative sum (state metric) of the branch metric obtained so far to compare the result with each of two paths joining into a certain state to select the path having a higher degree of likelihood. The ACS circuit 2 then supplies the resulting selection to the path memory circuit 5 and the newly obtained cumulative sum (state metric) to the normalizing circuit 3.

The normalizing circuit 3 normalizes the state metric outputted from the ACS circuit 2 to a level within a preset range to send the result to the state metric memory circuit 4.

The state metric memory circuit 4 stores the normalized state metric sent from the normalizing circuit 3 to send the state metric to the ACS circuit 2 and the path decode word decision circuit 6.

The path memory circuit 5 stores the selection result outputted from the ACS circuit 2 to supply it to the path decode word decision circuit 6.

Figure 2:
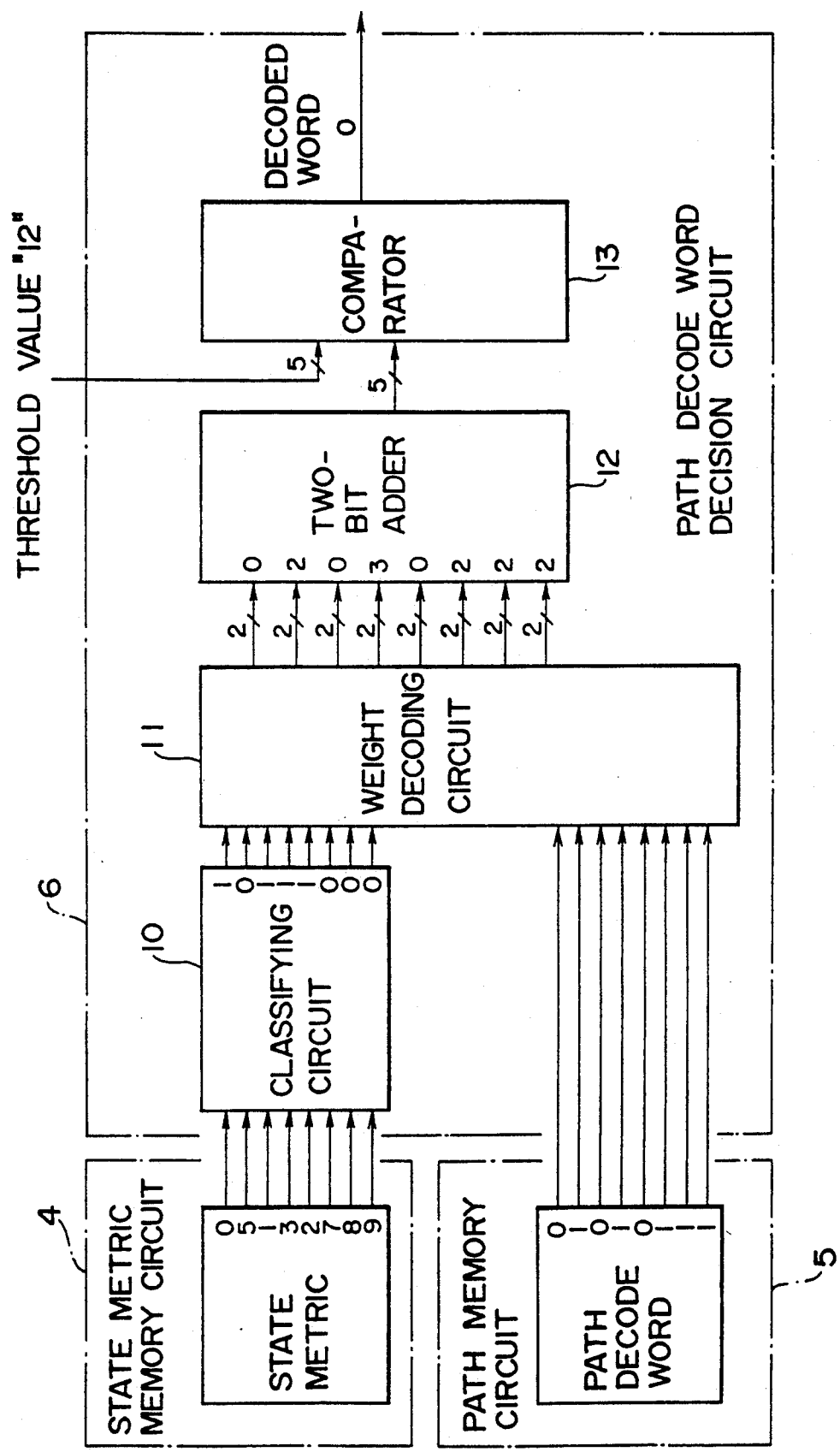
FIG. 2 is a block diagram showing an example of a circuit constitution of a path decode word decision circuit shown in FIG. 1.

The path decode word decision circuit 6, consisting of a classifying circuit 10, a weight decoding circuit 11, a two-bit adder 12, and a comparator 13 as shown in FIG. 2, weights the selection stored in the path memory circuits 5 based on the state metric stored in the state metric memory circuit 4. The decision circuit then compare the value obtained by this weighting with the preset threshold value to determine the path of maximum likelihood and generate the decode data to be output.

The classifying circuit 10 classifies all paths into two classes based on the state metric output from the state metric memory circuit 4 and supplies the result to the weight decoding circuit 11 as class information.

The weight decoding circuit 11 weights a one-bit path decode word supplied from the path memory circuit 5 based on the class information output from the classifying circuit 10 and makes the one-bit path decode word into an equivalent two-bit path decode word to be supplied to the two-bit adder 12.

Figure 3:
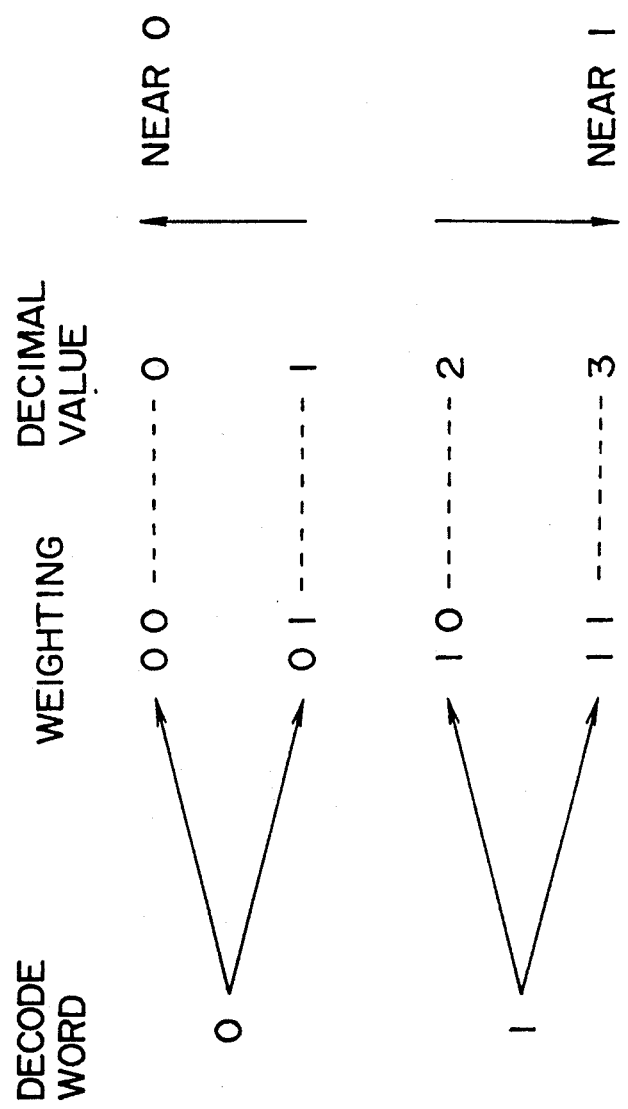
FIG. 3 is a schematic diagram showing an example of an operation of the path decode word decision circuit shown in FIG. 1.
Figure 5:
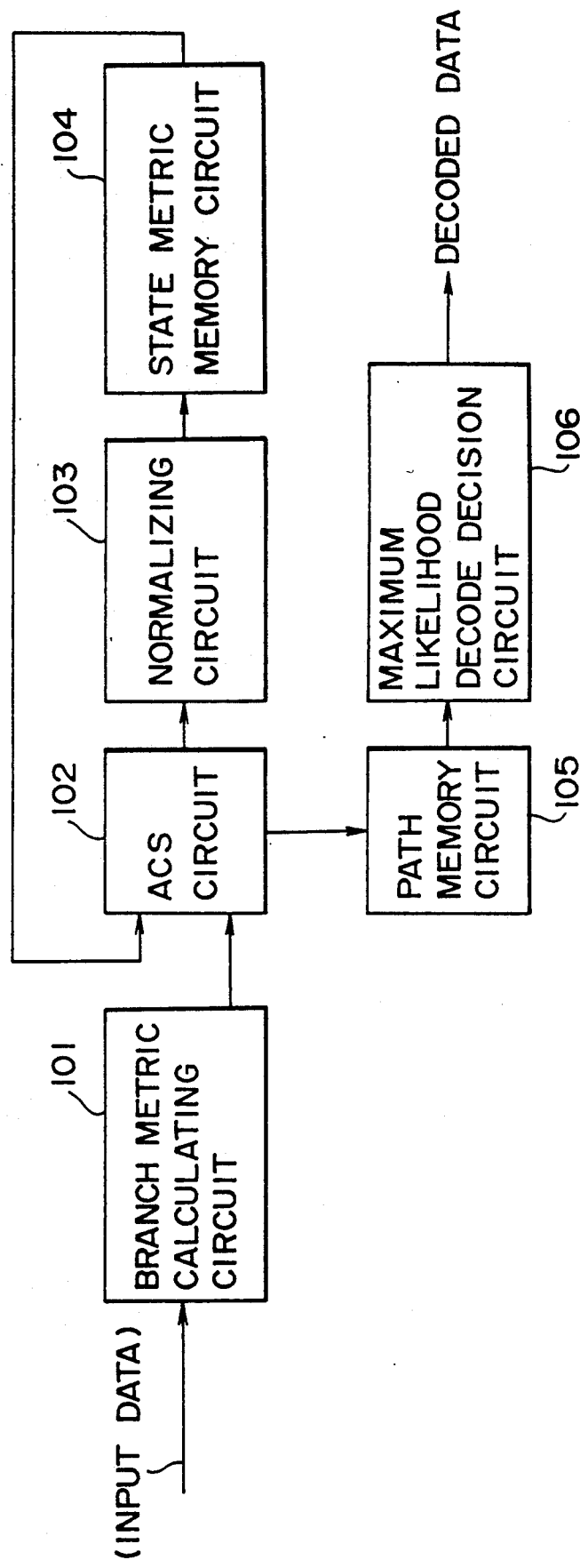
FIG. 5 is a block diagram showing a typical prior art Viterbi decoding apparatus.

In this case, if the class information output from the classifying circuit 10 indicates "upper class" for each path as shown in FIG. 3, this path decode word is set to "00" when the path decode word output from the path memory circuit 5 is "0" and "11" when it is "1". If the class information output from the classifying circuit 10 indicates "lower class," this path decode word is set to "01" when the path decode word output from the path memory circuit 5 is "0" and "10" when it is "1".

The two-bit adder 12 cumulatively adds weighted path decode words output from the weight decoding circuit 11 and supplies the resulting cumulative sum data to the comparator 13.

The comparator 13 compares the preset threshold value "12" with the cumulative sum data output from the two-bit adder 12 to determine the decode word to be output.

In this case, if the state changes from "000" to "001" and finally to "111" accompanied by the change of path memory value from "0" to "1" and finally to "1" and a decision is made by majority based on only this path memory value, "1" is obtained as the decode word because there are three "0"s and five "1"s. However, with the method of the present invention, path memory values "0," "1" through "1" are weighted based on state metrics "0," "5" through "4" corresponding to the path memory values to obtain two-bit decode words "00," "10" through "10" and these weighted path decode words are cumulatively added to obtain decode word "01011" ("11" in decimal notation) for each path.

Consequently, if this decode word "01011" ("11" in decimal notation) is compared with the preset threshold value, for example, value "01100" ("12" in decimal notation) obtained by additively averaging accumulated value "4" obtained when the weighted path decode words are all "0"s and accumulated value "20" obtained when they are all "1"s, "0" is obtained as a decode word. Thus, this method provides a higher degree of likelihood in decoding than any of the conventional methods in which a decode word is determined by using either the number of "0"s and "1"s to judge which is greater or decision by majority of given m.

As described above, in the embodiment of the present invention, the decode word is determined by comparing the path decode word obtained by weighting the path memory value according to the state metric value with the preset threshold value, thereby providing sufficiently reliable decode words by a small amount of hardware and in a short processing time to decode, within an average information rate, convolutional codes having information amounting to 30 Mbps or more used in high-definition TV, etc.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A Viterbi decoding apparatus for decoding received data by Viterbi decoding, comprising:
    a state metric memory circuit for storing state metric information obtained by adder-comparator-selector (ACS) processing;
    a path memory circuit for storing select information provided by said ACS processing; and
    a path decode word decision circuit coupled to said path memory circuit and to said state metric memory circuit for weighting a plurality of bits of a path decode word from said path memory circuit according to its degree of likelihood based on state metric information supplied from said state metric memory circuit, cumulatively adding each weighted path decode word obtained by said weighting operation, and comparing a cumulative value obtained by said cumulative adding operation with a preset threshold value to determine a decode word.

2. A Viterbi decoding apparatus as defined in claim 1, further comprising:
    a branch metric calculating circuit to which received data is supplied;
    an ACS circuit to which a result of an operation of said branch metric calculating circuit is supplied for carrying out said ACS processing; and
    a normalizing circuit for normalizing said state metric supplied from said ACS circuit.

3. A Viterbi decoding apparatus as defined in claim 2, wherein said ACS circuit, based on the branch metric as a Hamming distance between a signal coming from said branch metric calculating circuit and a path and the state metric as a cumulative sum of the branch metric supplied from said state metric memory circuit, adds the branch metric to the state metric to compare the result with each of paths joining into a certain state to select a path having a higher degree of likelihood, supplying the resulting select signal to said path memory circuit and a newly obtained state metric to said normalizing circuit.

4. A Viterbi decoding apparatus as defined in claim 3, wherein said normalizing circuit normalizes the state metric supplied from said ACS circuit into a value falling in a predefined range.

5. A Viterbi decoding apparatus as defined in claim 4, wherein said state metric memory circuit stores the normalized state metric to supply it to said ACS circuit and said path decode word decision circuit.

6. A Viterbi decoding apparatus as defined in claim 5, wherein said path decode word decision circuit is further supplied with an output from said path memory circuit which stores the select signal sent from said ACS circuit.

7. A Viterbi decoding apparatus as defined in claim 6, wherein said path decode word decision circuit comprises:
    a classifying circuit for classifying all paths into two classes based on the state metric supplied from said state metric memory circuit;
    a weight decoding circuit for weighting a one-bit path decode word supplied from said path memory circuit based on the classification result supplied as class information to generate an equivalent weighted two-bit path decode word;
    a two-bit adder for cumulatively adding said weighted path decode word from said weight decoding circuit to obtain cumulative sum data; and
    a comparator for comparing a preset threshold value with said cumulative sum data to determine a decode word.

8. A Viterbi decoding apparatus as defined in one of claims 1, 2, 3, 4, 5, 6 or 7, wherein said received signal is a high-definition TV signal.

* * * * *